United States Patent
Yim et al.

(10) Patent No.: US 7,297,376 B1
(45) Date of Patent: Nov. 20, 2007

(54) METHOD TO REDUCE GAS-PHASE REACTIONS IN A PECVD PROCESS WITH SILICON AND ORGANIC PRECURSORS TO DEPOSIT DEFECT-FREE INITIAL LAYERS

(75) Inventors: Kang Sub Yim, Santa Clara, CA (US); Kelvin Chan, Santa Clara, CA (US); Nagarajan Rajagopalan, Santa Clara, CA (US); Josephine Ju-Hwei Chang Liu, Boise, ID (US); Sang H. Ahn, Santa Clara, CA (US); Yi Zheng, San Jose, CA (US); Sang In Yi, Sunnyvale, CA (US); Vu Ngoc Tran Nguyen, Santa Clara, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/483,842

(22) Filed: Jul. 7, 2006

(51) Int. Cl.
    *H05H 1/24* (2006.01)
(52) U.S. Cl. .................. 427/578; 427/532
(58) Field of Classification Search ............ 427/248.1, 427/255.28, 569, 578
    See application file for complete search history.

(56) References Cited

U.S. PATENT DOCUMENTS

| | | |
|---|---|---|
| 4,845,054 A | 7/1989 | Mitchener |
| 5,000,113 A | 3/1991 | Wang et al. |
| 5,003,178 A | 3/1991 | Livesay |
| 5,129,359 A | 7/1992 | Takei et al. |
| 5,186,718 A | 2/1993 | Tepman et al. |
| 5,541,444 A | 7/1996 | Ohmi et al. |
| 5,554,570 A | 9/1996 | Maeda et al. |

(Continued)

FOREIGN PATENT DOCUMENTS

EP     0 935 283     8/1999

(Continued)

OTHER PUBLICATIONS

PCT International Search Report and Written Opinion for PCT/US2005/003425, dated May 6, 2005.

(Continued)

*Primary Examiner*—Timothy Meeks
*Assistant Examiner*—Elizabeth Burkhart
(74) *Attorney, Agent, or Firm*—Patterson & Sheridan

(57) ABSTRACT

A method for depositing a low dielectric constant film is provided by positioning a substrate within a processing chamber having a powered electrode, and flowing into the processing chamber an initiation gas mixture of a flow rate of one or more organosilicon compounds and a flow rate of one or more oxidizing gases to deposit an initiation layer by applying an RF power to the electrode. The organosilicon compound flow rate is then ramped-up to a final flow rate to deposit a first transition layer, upon which one or more porogen compounds is introduced and the flow rate porogen compound is ramped up to a final deposition rate while depositing a second transition layer. A porogen doped silicon oxide layer is then deposited by flowing the final porogen and organosilicon flow rates until the RF power is turned off.

26 Claims, 4 Drawing Sheets

U.S. PATENT DOCUMENTS

| | | | |
|---|---|---|---|
| 5,628,828 | A | 5/1997 | Kawamura et al. |
| 5,776,990 | A | 7/1998 | Hedrick et al. |
| 5,855,681 | A | 1/1999 | Maydan et al. |
| 5,926,689 | A | 7/1999 | Cote et al. |
| 5,989,998 | A | 11/1999 | Sugahara et al. |
| 6,051,321 | A | 4/2000 | Lee et al. |
| 6,054,379 | A | 4/2000 | Yau et al. |
| 6,057,251 | A | 5/2000 | Goo et al. |
| 6,068,884 | A | 5/2000 | Rose et al. |
| 6,080,526 | A | 6/2000 | Yang et al. |
| 6,136,654 | A | 10/2000 | Kraft et al. |
| 6,153,871 | A | 11/2000 | Livingston |
| 6,169,039 | B1 | 1/2001 | Lin et al. |
| 6,235,650 | B1 | 5/2001 | Yao |
| 6,251,770 | B1 | 6/2001 | Uglow et al. |
| 6,270,900 | B1 | 8/2001 | Wakizaka et al. |
| 6,271,146 | B1 | 8/2001 | Ross |
| 6,303,047 | B1 | 10/2001 | Aronowitz et al. |
| 6,312,793 | B1 | 11/2001 | Grill et al. |
| 6,316,063 | B1 | 11/2001 | Andideh et al. |
| 6,340,435 | B1 | 1/2002 | Bjorkman et al. |
| 6,340,628 | B1 | 1/2002 | Van Cleemput et al. |
| 6,348,725 | B2 | 2/2002 | Cheung et al. |
| 6,352,945 | B1 | 3/2002 | Matsuki et al. |
| 6,383,955 | B1 | 5/2002 | Matsuki et al. |
| 6,407,399 | B1 | 6/2002 | Livesay |
| 6,410,463 | B1 | 6/2002 | Matsuki |
| 6,432,846 | B1 | 8/2002 | Matsuki |
| 6,437,443 | B1 | 8/2002 | Grill et al. |
| 6,441,491 | B1 | 8/2002 | Grill et al. |
| 6,444,136 | B1 | 9/2002 | Liu et al. |
| 6,455,445 | B2 | 9/2002 | Matsuki |
| 6,479,110 | B2 | 11/2002 | Grill et al. |
| 6,486,082 | B1 | 11/2002 | Cho et al. |
| 6,500,773 | B1 | 12/2002 | Gaillard et al. |
| 6,509,259 | B1 | 1/2003 | Wang et al. |
| 6,514,880 | B2 | 2/2003 | Matsuki et al. |
| 6,518,646 | B1 | 2/2003 | Hopper et al. |
| 6,521,302 | B1 | 2/2003 | Campana-Schmitt et al. |
| 6,524,874 | B1 | 2/2003 | Alwan |
| 6,541,367 | B1 | 4/2003 | Mandal |
| 6,548,899 | B2 | 4/2003 | Ross |
| 6,570,256 | B2 | 5/2003 | Conti et al. |
| 6,582,777 | B1 | 6/2003 | Ross et al. |
| 6,583,048 | B1 | 6/2003 | Vincent et al. |
| 6,583,071 | B1 | 6/2003 | Weidman et al. |
| 6,593,655 | B1 | 7/2003 | Loboda et al. |
| 6,596,627 | B2 | 7/2003 | Mandal |
| 6,605,549 | B2 | 8/2003 | Leu et al. |
| 6,669,858 | B2 | 12/2003 | Bjorkman et al. |
| 6,677,253 | B2 | 1/2004 | Andideh et al. |
| 6,709,715 | B1 | 3/2004 | Lang et al. |
| 6,740,539 | B2 | 5/2004 | Conti et al. |
| 6,797,643 | B2 | 9/2004 | Rocha-Alvarez et al. |
| 6,846,515 | B2 | 1/2005 | Vrtis et al. |
| 6,911,403 | B2 | 6/2005 | Li et al. |
| 6,989,338 | B2 | 1/2006 | Choi et al. |
| 7,056,560 | B2 | 6/2006 | Yim et al. |
| 7,060,638 | B2 | 6/2006 | Nguyen et al. |
| 2002/0037442 | A1 | 3/2002 | Grill et al. |
| 2002/0098714 | A1 | 7/2002 | Grill et al. |
| 2002/0142579 | A1 | 10/2002 | Vincent et al. |
| 2002/0142585 | A1 | 10/2002 | Mandal |
| 2002/0160626 | A1 | 10/2002 | Matsuki et al. |
| 2002/0180051 | A1 | 12/2002 | Grill et al. |
| 2002/0197849 | A1 | 12/2002 | Mandal |
| 2003/0008998 | A1 | 1/2003 | Aoi |
| 2003/0017642 | A1* | 1/2003 | Conti et al. .......... 438/99 |
| 2003/0017718 | A1 | 1/2003 | Aoi |
| 2003/0040195 | A1 | 2/2003 | Chang et al. |
| 2003/0042605 | A1 | 3/2003 | Andideh et al. |
| 2003/0104689 | A1 | 6/2003 | Shioya et al. |
| 2003/0104708 | A1 | 6/2003 | Cho et al. |
| 2003/0109136 | A1 | 6/2003 | Shioya et al. |
| 2003/0111712 | A1 | 6/2003 | Andideh |
| 2003/0116421 | A1 | 6/2003 | Xu et al. |
| 2003/0124874 | A1 | 7/2003 | Matsuki |
| 2003/0176030 | A1 | 9/2003 | Tsuji et al. |
| 2003/0198742 | A1 | 10/2003 | Vrtia et al. |
| 2003/0224593 | A1 | 12/2003 | Wong |
| 2003/0232137 | A1 | 12/2003 | Vrtis et al. |
| 2004/0038514 | A1 | 2/2004 | Hyodo et al |
| 2004/0039219 | A1 | 2/2004 | Chen et al. |
| 2004/0096593 | A1 | 5/2004 | Lukas et al. |
| 2004/0096672 | A1 | 5/2004 | Lukas et al. |
| 2004/0101633 | A1* | 5/2004 | Zheng et al. .......... 427/551 |
| 2004/0175501 | A1 | 9/2004 | Lukas et al. |
| 2004/0175957 | A1 | 9/2004 | Lukas et al. |
| 2004/0197474 | A1 | 10/2004 | Vrtis et al. |
| 2005/0130440 | A1 | 6/2005 | Yim et al. |
| 2005/0227502 | A1 | 10/2005 | Schmitt et al. |
| 2006/0043591 | A1 | 3/2006 | Yim et al. |
| 2006/0046520 | A1* | 3/2006 | Padhi et al. .......... 438/778 |
| 2006/0160376 | A1* | 7/2006 | Padhi et al. .......... 438/789 |

FOREIGN PATENT DOCUMENTS

| | | |
|---|---|---|
| EP | 1 354 980 | 10/2003 |
| WO | WO 97/00535 | 1/1997 |
| WO | WO 99/21706 | 5/1999 |
| WO | WO 01/29052 | 4/2001 |
| WO | WO 01/61737 | 8/2001 |
| WO | WO 09/95702 | 11/2003 |

OTHER PUBLICATIONS

Paul Kallender, "Toshiba, Fujitsu Report 100-Nanometer Process Gains", EE Times, Nov. 8, 2001. http://www.eetimes.com/story/OEG2001106S0034.

\* cited by examiner

METHOD TO REDUCE GAS-PHASE REACTIONS IN A PECVD PROCESS WITH SILICON AND ORGANIC PRECURSORS TO DEPOSIT DEFECT-FREE INITIAL LAYERS

BACKGROUND OF THE INVENTION

1. Field of the Invention

Embodiments of the present invention generally relate to the fabrication of integrated circuits. More particularly, the embodiments relates to methods for depositing dielectric layers on a substrate and structures that include the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 µm and even 0.1 µm feature sizes, and tomorrow's plants soon will be producing devices having even smaller geometries.

In order to further reduce the size of devices on integrated circuits, it has become necessary to use conductive materials having low resistivity and to use insulators having low dielectric constants (k) to reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process. Other examples of low k materials include carbon doped silicon oxides and polytetrafluoroethylene. However, the continued reduction in device geometries has generated a demand for films having even lower k values.

Recent developments in low dielectric constants have focused on incorporating silicon, carbon, and oxygen atoms into the deposited film. One of the approaches to obtain an ultra low dielectric constant is to fabricate hybrid films of an organic porogen and a silicon matrix. During the post-treatment, the porogens are removed, resulting in porous low k materials. These porous films are known to have less adhesion to underlying barrier layers than silicon oxides. Improvement of adhesion may be obtained by depositing an initiation layer of oxide, which can enhance adhesion at the interface. To further improve adhesion, it has been suggested to use a gradient layer with increasing carbon content gradually between initiation and main deposition step. However, this method can cause undesirable gas phase reaction causing unwanted particles to form in the films, resulting in defect issues. Therefore, there is a need for a process for making low dielectric constant materials with improved adhesion and without particle defect issues.

SUMMARY OF THE INVENTION

Embodiments of the present invention generally provide a method for depositing a low dielectric constant film. In one embodiment, the method provides depositing an organosilicate dielectric layer by positioning a substrate within a processing chamber having a powered electrode, flowing an initiation gas mixture into the processing chamber, the initiation gas mixture including a flow rate of one or more organosilicon compounds and a flow rate of one or more oxidizing gases, depositing a silicon oxide layer on the substrate by applying a radio frequency power to the powered electrode, ramping-up the flow rate of the one or more organosilicon compounds until reaching a final flow rate of the one or more organosilicon compounds while depositing a first transition layer on the silicon oxide layer, flowing the final flow rate of the one or more organosilicon compounds while flowing a flow rate of a gas mixture including one or more porogen compounds, ramping-up the flow rate of the one or more porogen compounds until reaching a final flow rate of the one or more porogen compounds while depositing a second transition layer on the first transition layer, flowing the final flow rate of the one or more organosilicon compounds and the final flow rate of the one or more porogen compounds to deposit a porogen doped silicon oxide layer on the second transition layer, and terminating the radio frequency power.

In a further embodiment, the method for depositing a low dielectric constant film includes an initiation step, a first transition step, a second transition step, and a deposition step. The initiation step includes flowing an initiation gas mixture into the processing chamber, the initiation gas mixture including a flow rate of one or more organosilicon compounds and a flow rate of one or more oxidizing gases, and depositing a silicon oxide layer on the substrate by applying a radio frequency power to the powered electrode. The first transition step includes ramping-up the flow rate of the one or more organosilicon compounds until reaching a final flow rate of the one or more organosilicon compounds, providing a flow rate of one or more oxidizing gases into the processing chamber, and depositing a first transition layer on the silicon oxide layer by applying the radio frequency power to the powered electrode. The second transition step includes ramping-up the flow rate of the one or more porogen compounds until reaching a final flow rate of the one or more porogen compounds, providing the final flow rate of the one or more organosilicon compounds into the processing chamber, providing the flow rate of one or more oxidizing gases into the processing chamber, and depositing a second transition layer on the first transition layer by applying the radio frequency power to the powered electrode. The deposition step includes providing the final flow rate of the one or more organosilicon compounds into the processing chamber, providing the final flow rate of the one or more porogen compounds into the processing chamber, providing the flow rate of one or more oxidizing gases into the processing chamber, and depositing a porogen doped silicon oxide layer on the second transition layer by applying the radio frequency power to the powered electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments in accordance with the present invention relate to techniques for depositing ultra low K nanoporous films in multiple stages.

Incorporated by reference herein for all purposes are U.S. Pat. Nos. 6,541,367 and 6,596,627. These patents describe depositing a nano-porous silicon oxide layer having a low dielectric constant. The nano-porous silicon oxide layer is produced by plasma enhanced (PECVD) or microwave enhanced chemical vapor deposition of a silicon/oxygen containing material that optionally contains thermally labile organic groups, and by controlled annealing of the deposited silicon/oxygen containing material to form microscopic voids that are uniformly dispersed in a silicon oxide layer. The relative volume of the microscopic gas pockets to the silicon oxide layer is controlled to preferably maintain a closed cell foam structure that provides low dielectric constants after annealing. The nano-porous silicon oxide layers will have dielectric constants less than about 3.0, preferably less than about 2.5.

Figure 1:
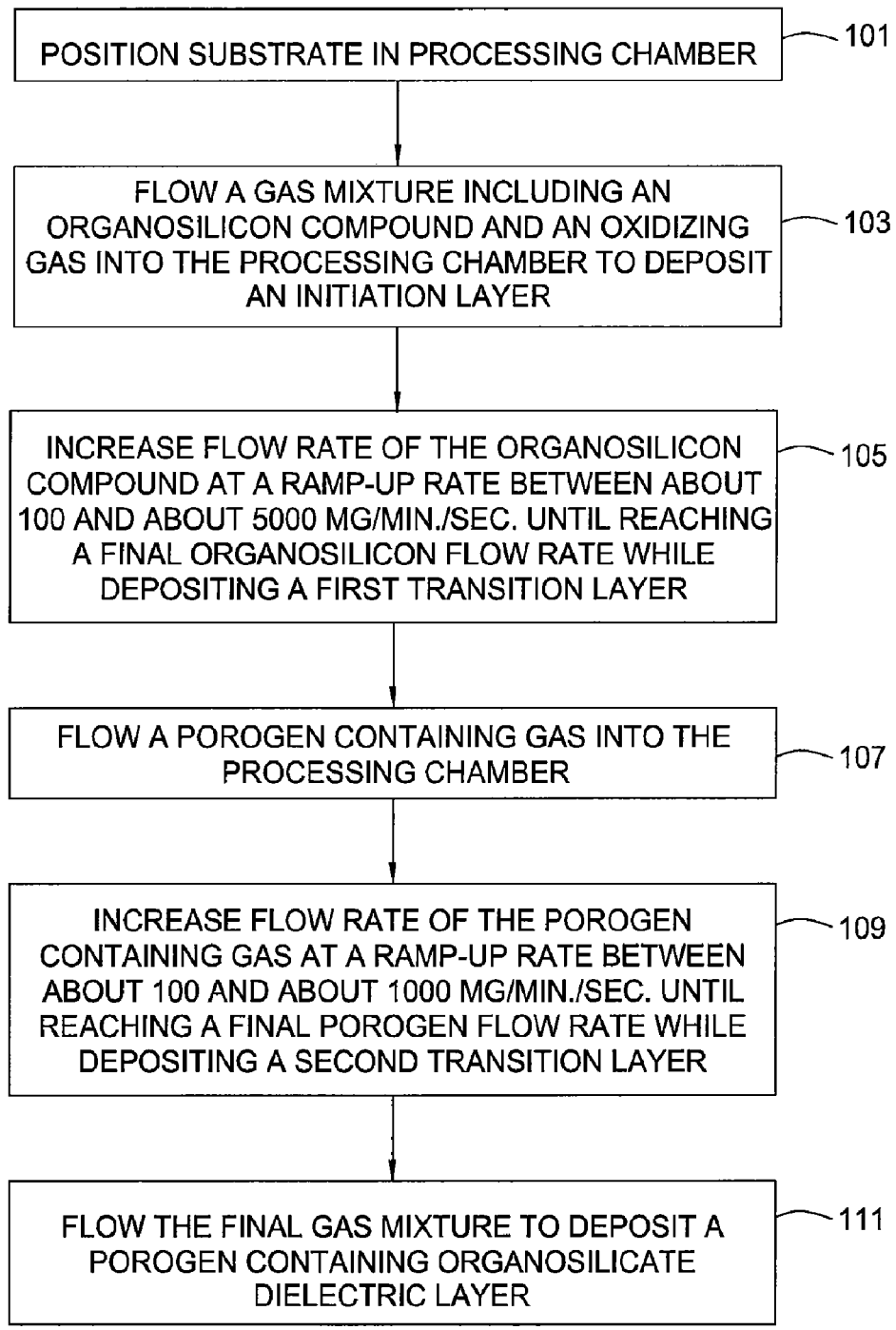
FIG. 1 is a process flow diagram illustrating a first method according to an embodiment of the invention.

FIG. 1 is a process flow diagram illustrating a method of depositing an organosilicate dielectric layer according to an embodiment of the invention. The silicon/oxygen material is chemical vapor deposited by reacting one or more organosilicon compounds and one or more unsaturated non-silicon compounds having thermally labile groups (porogen) with one or more oxidizing gases. In step 101, a substrate is positioned on a substrate support in a processing chamber capable of performing PECVD. In step 103, a gas mixture having a composition including one or more organosilicon compounds and one or more oxidizing gases is introduced into the chamber through a gas distribution plate, such as a showerhead. A radio-frequency (RF) power is applied to an electrode, such as the showerhead, in order to provide plasma processing conditions in the chamber. The gas mixture is reacted in the chamber in the presence of RF power to deposit an initiation layer comprising a silicon oxide layer that adheres strongly to the underlying substrate.

In step 105, the flow rate of the one or more organosilicon compounds is increased at a ramp-up rate between about 100 mg/min./sec. and about 5000 mg/min./sec., preferably, between about 1000 mg/min./sec. and about 2000 mg/min./sec., in the presence of the RF power, to deposit a first transition layer until reaching a predetermined organosilicon compound gas mixture. The ramp-up of the flow rate conditions is performed such that variation in DC bias of the gas distribution plate is less than 60 volts, preferably less than 30 volts, to avoid plasma induced damage (PID).

In step 107, while keeping the predetermined organosilicon compound gas mixture constant, a gas mixture having a composition including one or more porogen compounds is introduced into the chamber through the gas distribution plate. In step 109, the flow rate of the one or more porogen compounds is increased at a ramp-up rate between about 100 mg/min./sec. and about 5000 mg/min./sec., preferably, between about 200 mg/min./sec. and about 1000 mg/min./sec., to deposit a second transition layer until reaching a predetermined final gas mixture.

In step 111, the predetermined final gas mixture, the final gas mixture having a composition including the one or more organosilicon compounds and the one or more porogen compounds is reacted in the chamber, in the presence of RF power, to deposit a final layer having a porogen silicon oxide layer. Upon completion, the RF power is terminated. The chamber pressure is maintained during the RF power termination, such as by not opening the chamber throttle valve. Not wishing to be bound by theory, it is believed that by separating the ramp-up rates of the organosilicon compounds and the porogen compounds a more stable and manufacturable process can be obtained, yielding organosilicate dielectric layers with less defect issues, such as particle adders. The organosilicate dielectric layers may have less than 50 particle adders above 0.16 μm, preferably, less than 25, and more preferably, less than 10.

In another embodiment, step 109, depositing the second transition layer, may be combined with step 111, depositing the final porogen silicon oxide layer. In this embodiment, the porogen compound flow rate is continuously ramped-up while flowing the predetermined organosilicon compound gas mixture during the porogen silicon oxide layer deposition.

Figure 2:
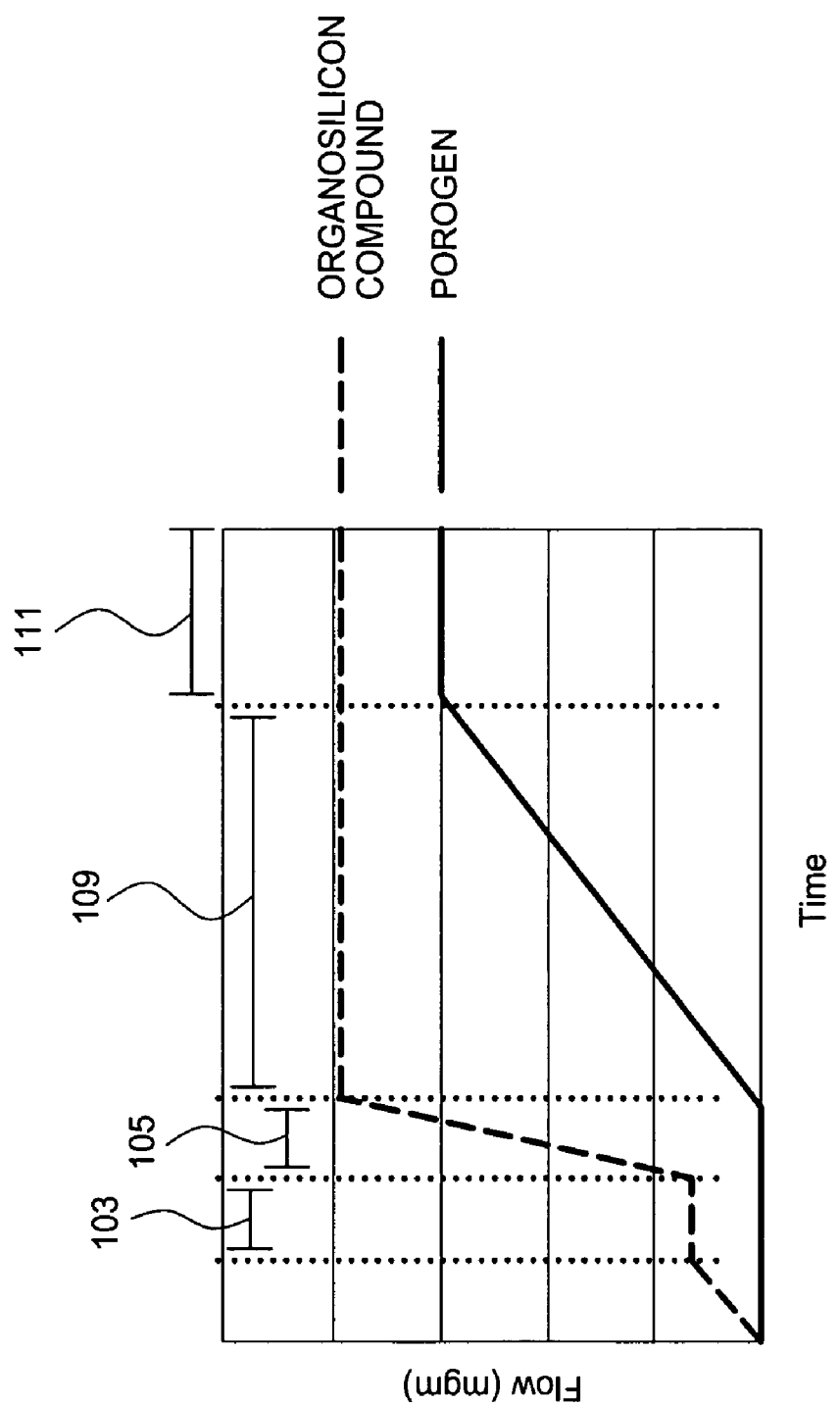
FIG. 2 is a graph of the flow rates of the precursors according to an embodiment of the invention.

FIG. 2 illustrates in a graph the flow rates of the one or more organosilicon compounds and the one or more porogen compounds versus time according to an embodiment of the invention. The gas mixture having a composition including one or more organosilicon compounds and one or more oxidizing gases is introduced into the chamber to deposit an initiation layer, as described above with respect to step 103 of FIG. 1. The initiation layer deposition may have a time range of between about 1 second and about 10 seconds. In one embodiment, the initiation layer deposition may last for about 2 seconds.

The flow rate of the one or more organosilicon compounds is then increased at the ramp-up rate to deposit a first transition layer until reaching a predetermined organosilicon compound gas mixture, as described above with respect to step 105 of FIG. 1. The first transition layer deposition may have a time range of between about 1 second and about 10 seconds. In one embodiment, first transition layer deposition time may be about 2 seconds.

While keeping the predetermined organosilicon compound gas mixture constant, a gas mixture having a composition including one or more porogen compounds is introduced into the chamber, and the flow rate of the one or more porogen compounds is increased at a ramp-up rate to deposit a second transition layer until reaching a predetermined final gas mixture, as described above with respect to step 109 of FIG. 1. The second transition layer deposition may have a time range of between about 1 second and about 180 seconds. In one embodiment, the second transition layer deposition time may be about 4 seconds.

The predetermined final gas mixture having a composition including the one or more organosilicon compounds and the one or more porogen compounds, is reacted in the chamber in the presence of RF power to deposit a final layer comprising a porogen silicon oxide layer, as described above with respect to step 111 of FIG. 1. The final layer deposition may have a time range of between about 15 second and about 180 seconds. In one embodiment, the final layer deposition time may be about 58 seconds.

In another embodiment, the combination of step 109 with step 111 may have a time range of between about 1 second and about 180 seconds.

Figure 3:
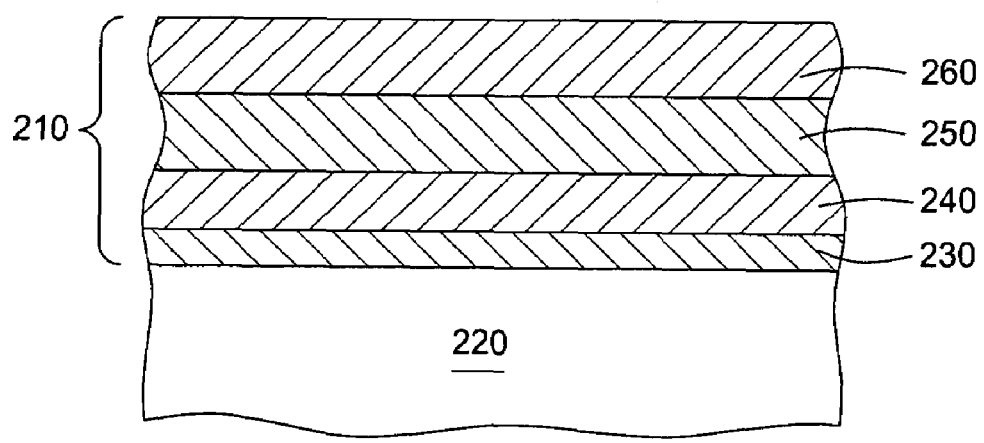
FIG. 3 is a cross-sectional view of an organosilicate dielectric layer formed according to embodiments of the invention.

FIG. 3 schematically illustrates a cross-sectional view of a porogen organosilicate dielectric layer formed according to embodiments of the present invention. An organosilicate dielectric layer 210 is deposited on an underlying layer (e.g., barrier layer) 220 of the surface of a substrate disposed in a processing chamber capable of performing PECVD. A plasma of the gas mixture comprising a flow rate of one or more organosilicon compounds is formed, as described above with respect to step 103 of FIG. 1, to deposit a silicon oxide initiation layer 230 having strong adhesion to the underlying layer 220. The initiation layer 230 may be deposited to a thickness in a range of about 5 Å to about 100 Å, preferably about 20 Å to about 60 Å. After depositing the initiation layer 230, the flow rate of the one or more organosilicon compounds is gradually increased to a predetermined organosilicon compound gas mixture, such that variation in DC bias of the gas distribution plate is less than 60 volts to avoid PID.

While gradually increasing the flow rate of the one or more organosilicon compounds, a first transition layer 240 is deposited onto the initiation layer 230, as described above with respect to step 107 of FIG. 1. The first transition layer 240 may be deposited to a thickness in a range of about 10 Å to about 300 Å, preferably about 100 Å to about 200 Å. Upon reaching the organosilicon compound gas mixture composition, a flow of one or more porogen compounds is introduced, as described above with respect to step 107 of FIG. 1, and the flow rate of the porogen compound may be gradually increased to a predetermined porogen compound gas mixture.

While gradually increasing the flow rate of the one or more porogen compounds, a second transition layer 250 is deposited onto the first transition layer 240, as described above with respect to step 109 of FIG. 1. The second transition layer 250 may be deposited to a thickness in a range of about 10 Å to about 600 Å, preferably, about 100 Å to about 400 Å.

Upon reaching the final gas mixture composition, a plasma of the final gas mixture comprising a flow rate of one or more organosilicon compounds and a flow rate of the one or more porogen compounds is formed, as described above with respect to step 111 of FIG. 1, to deposit a porogen-containing organosilicate dielectric layer 260. The porogen-containing organosilicate dielectric layer 260 may be deposited to a thickness in a range of about 200 Å to about 10,000 Å until the RF power is terminated.

Figure 4:
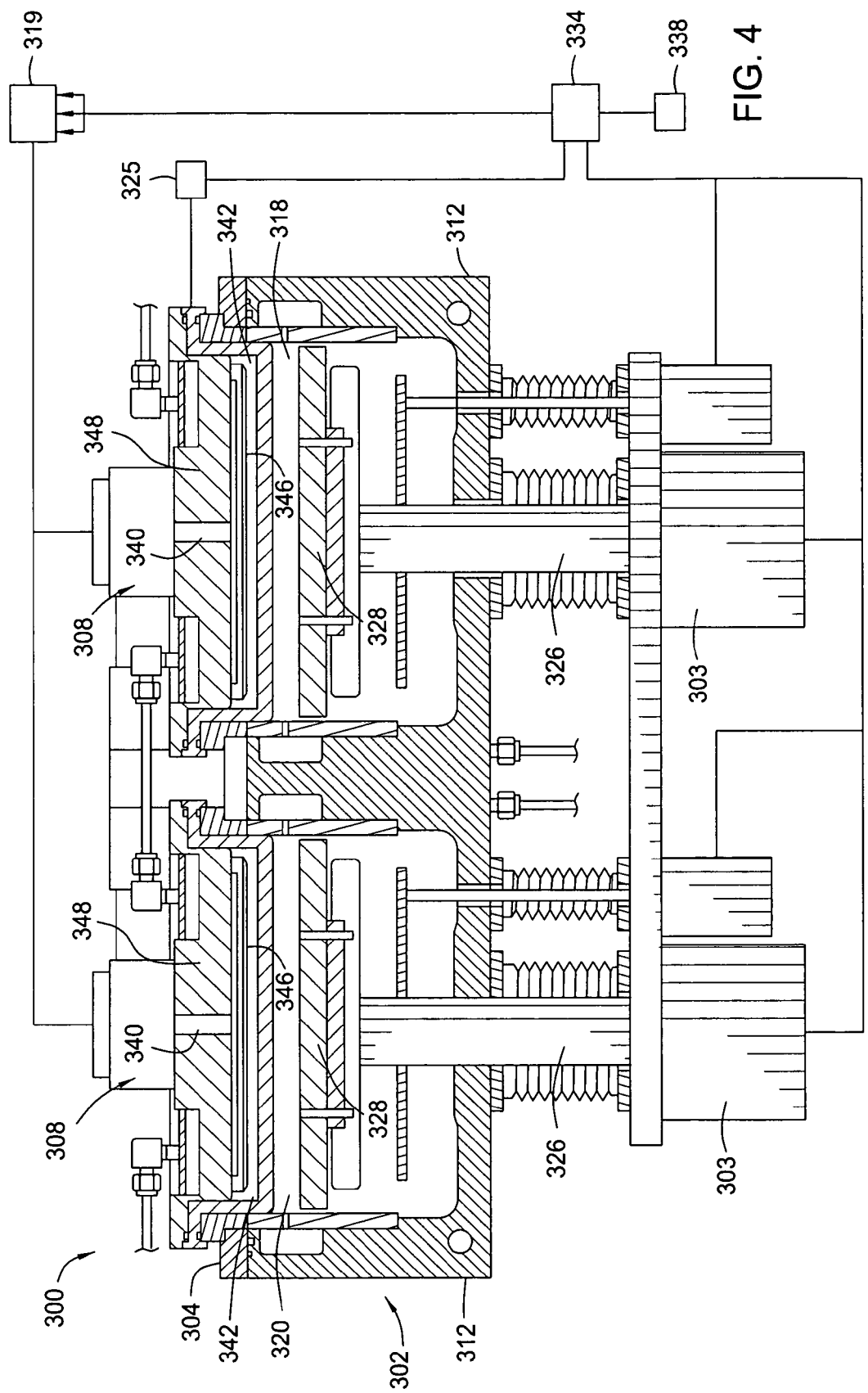
FIG. 4 is a cross-sectional diagram of an exemplary processing chamber that may be used for practicing embodiments of the invention.

In another embodiment, step 109 depositing the second transition layer may be combined with step 111 depositing the final porogen silicon oxide layer. In this manner, the final porogen silicon oxide layer may have a gradient concentration of porogen where the concentration of porogen in the silicon oxide layer increases as the porogen silicon oxide layer is deposited. This gradient layer may be deposited to a thickness in a range of about 50 Å to about 10,000 Å, preferably, about 100 Å to about 5000 Å, until the RF power is terminated FIG. 4 presents a cross-sectional, schematic diagram of a chemical vapor deposition (CVD) chamber 300 for depositing a carbon-doped silicon oxide layer. This figure is based upon features of the PRODUCER® chambers currently manufactured by Applied Materials, Inc. The PRODUCER® CVD chamber (200 mm or 300 mm) has two isolated processing regions that may be used to deposit carbon-doped silicon oxides and other materials. A chamber having two isolated processing regions is described in U.S. Pat. No. 5,855,681, which is incorporated by reference herein.

The deposition chamber 300 has a chamber body 302 that defines separate processing regions 318, 320. Each processing region 318, 320 has a pedestal 328 for supporting a substrate (not seen) within the chamber 300. The pedestal 328 typically includes a heating element (not shown). Preferably, the pedestal 328 is movably disposed in each processing region 318, 320 by a stem 326 which extends through the bottom of the chamber body 302 where it is connected to a drive system 303. Internally movable lift pins (not shown) are preferably provided in the pedestal 328 to engage a lower surface of the substrate. The lift pins are engaged by a lift mechanism (not shown) to receive a substrate before processing, or to lift the substrate after deposition for transfer to the next station.

Each of the processing regions 318, 320 also preferably includes a gas distribution assembly 308 disposed through a chamber lid 304 to deliver gases into the processing regions 318, 320. The gas distribution assembly 308 of each processing region normally includes a gas inlet passage 340 through manifold 348 which delivers gas from a gas distribution manifold 319 through a blocker plate 346 and then through a showerhead 342. The showerhead 342 includes a plurality of nozzles (not shown) through which gaseous mixtures are injected during processing. An RF (radio frequency) supply 325 provides a bias potential to the showerhead 342 to facilitate generation of a plasma between the showerhead and the pedestal 328. During a plasma-enhanced chemical vapor deposition process, the pedestal 328 may serve as a cathode for generating the RF bias within the chamber body 302. The cathode is electrically coupled to an electrode power supply to generate a capacitive electric field in the deposition chamber 300. Typically an RF voltage is applied to the cathode while the chamber body 302 is electrically grounded. Power applied to the pedestal 328 creates a substrate bias in the form of a negative voltage on the upper surface of the substrate. This negative voltage is used to attract ions from the plasma formed in the chamber 300 to the upper surface of the substrate. The capacitive electric field forms a bias which accelerates inductively formed plasma species toward the substrate to provide a more vertically oriented anisotropic filming of the substrate during deposition, and etching of the substrate during cleaning.

During processing, process gases are uniformly distributed radially across the substrate surface. The plasma is formed from one or more process gases or a gas mixture by applying RF energy from the RF power supply 325 to the showerhead 342, which acts as a powered electrode. Film deposition takes place when the substrate is exposed to the plasma and the reactive gases provided therein. The chamber walls 312 are typically grounded. The RF power supply 325 can supply either a single or mixed-frequency RF signal to the showerhead 342 to enhance the decomposition of any gases introduced into the processing regions 318, 320.

A system controller 334 controls the functions of various components such as the RF power supply 325, the drive system 303, the lift mechanism, the gas distribution manifold 319, and other associated chamber and/or processing functions. The system controller 334 executes system control software stored in a memory 338, which in the preferred embodiment is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma processing chambers may also be employed for practicing embodiments of the invention.

Precursors and Processing Conditions for Deposition of Organosilicate Layers

In any of the embodiments described herein, an organosilicate dielectric layer is deposited from a process gas mixture comprising an organosilicon compound and a porogen. The organosilicate layer may be used as a dielectric layer. The dielectric layer may be used at different levels within a device. For example, the dielectric layer may be used as a premetal dielectric layer, an intermetal dielectric layer, or a gate dielectric layer. The organosilicate layer is preferably a low-k dielectric layer, i.e., having a dielectric constant of less than about 3.0.

A wide variety of process gas mixtures may be used to deposit the organosilicate dielectric layer, and non-limiting examples of such gas mixtures are provided below. Generally, the gas mixture includes one or more organosilicon compounds (e.g., a first and a second organosilicon compound), one or more porogen compounds, a carrier gas, and an oxidizing gas. These components are not to be interpreted as limiting, as many other gas mixtures including additional components such as hydrocarbons (e.g., aliphatic hydrocarbons) are contemplated.

The term "organosilicon compound" as used herein is intended to refer to silicon-containing compounds including carbon atoms in organic groups. The organosilicon compound may include one or more cyclic organosilicon compounds, one or more aliphatic organosilicon compounds, or a combination thereof. Some exemplary organosilicon compounds include tetramethylcyclotetrasiloxane (TMCTS), octamethylcyclotetrasiloxane (OMCTS), pentamethylcyclopentasiloxane, hexamethylcyclotrisiloxane, d iethoxymethylsilane (DEMS), dimethyld isiloxane, tetrasilano-2,6-dioxy-4,8-dimethylene, tetramethyldisiloxane, hexamethyldisiloxane (HMDS),1,3-bis(silanomethylene) disiloxane, bis(1-methyldisiloxanyl)methane, bis(1-methyldisiloxanyl)propane, hexamethoxydisiloxane (HMDOS), dimethyldimethoxysilane (DMDMOS), and dimethoxymethylvinylsilane (DMMVS), or derivatives thereof. The one or more organosilicon compounds may be introduced into the processing chamber at a flow rate in a range of about 10 mg/min. to about 5,000 mg/min., preferably between about 300 mg/min. and about 3,000 mg/min.

The term "porogen compound" as used herein is intended to refer to unsaturated non-silicon bearing components having thermally labile groups that have the property of reacting with a plasma-sustained oxidizing environment to form thermally labile molecules that deposit, and which, when subsequently exposed to elevated temperatures, thermally decompose to form volatile species with low boiling points. Decomposition and evolution of the thermally labile group's volatile species from the deposited film will leave voids in the structure, reducing the structure's density. Selectively removing embedded chemically reacted solid material within the deposited film by a thermal process results in low density films which have low dielectric constants. Some exemplary porogen compounds include linear or cyclic molecules such as butadiene, isoprene, cyclohexadiene, bicycloheptadiene, 1-methyl-4-(1-methylethyl)-1,3-cyclohexadiene (ATP or alpha-Terpinene), 1-methyl-4-(1-methylethyl)-Benzene (Cymene), 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, 1,4-dioxin, and fluorinated carbon derivatives thereof. The one or more porogen compounds may be introduced into the processing chamber at a flow rate in a range of about 10 mg/min. to about 5,000 mg/min., preferably between about 500 mg/min. and about 3,000 mg/min.

The gas mixture optionally includes one or more carrier gases. Typically, one or more carrier gases are introduced with the one or more organosilicon compounds and the one or more porogen compounds into the processing chamber. Examples of carrier gases that may be used include helium, argon, carbon dioxide, and combinations thereof. The one or more carrier gases may be introduced into the processing chamber at a flow rate less than about 20,000 sccm, depending in part upon the size of the interior of the chamber. Preferably the flow of carrier gas is in a range of about 500 sccm to about 1,500 sccm, and more preferably about 1,000 sccm. In some processes, an inert gas such as helium or argon is put into the processing chamber to stabilize the pressure in the chamber before reactive process gases are introduced.

The gas mixture also includes one or more oxidizing gases. Suitable oxidizing gases include oxygen ($O_2$), ozone ($O_3$), nitrous oxide ($N_2O$), carbon monoxide (CO), carbon dioxide ($CO_2$), and combinations thereof. The flow of oxidizing gas may be in a range of about 100 sccm to about 3,000 sccm, depending in part upon the size of the interior of the chamber. Typically, the flow of oxidizing gas is in a range of about 100 sccm to about 1,000 sccm. Disassociation of oxygen or the oxygen containing compounds may occur in a microwave chamber prior to entering the deposition chamber and/or by RF power as applied to process gas within the chamber.

During deposition, a controlled plasma is typically formed in the chamber adjacent to the substrate by RF energy applied to the showerhead using an RF power supply 325 as depicted in FIG. 4. Alternatively, RF power can be provided to the substrate support. The plasma may be generated using high frequency RF (HFRF) power, as well as low frequency RF (LFRF) power (e.g., dual frequency RF), constant RF, pulsed RF, or any other known or yet to be discovered plasma generation technique. The RF power supply 325 can supply a single frequency RF between about 5 MHz and about 300 MHz. In addition, the RF power supply 325 may also supply a single frequency LFRF between about 300 Hz to about 1,000 kHz to supply a mixed frequency to enhance the decomposition of reactive species of the process gas introduced into the process chamber. The RF power may be cycled or pulsed to reduce heating of the substrate and promote greater porosity in the deposited film. Suitable RF power may be a power in a range of about 10 W to about 5,000 W, preferably in a range of about 200 W to about 1000 W. Suitable LFRF power may be a power in a range of about 0 W to about 5,000 W, preferably in a range of about 0 W to about 200 W.

During deposition, the substrate is maintained at a temperature between about −20° C. and about 500° C., preferably between about 100° C. and about 450° C. The deposition pressure is typically between about 1 Torr and about 20 Torr, preferably between about 4 Torr and about 10 Torr. The deposition rate is typically between about 2,000 Å/min. and about 20,000 Å/min.

Preferably, after the low dielectric constant film is deposited, the film is post-treated. The film may be post-treated with a thermal or plasma enhanced annealing process or an electron beam treatment. In one embodiment, the film is annealed at a temperature between about 200° C. and about 400° C. for about 2 seconds to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10 Torr. The RF power during the annealing is about 200 W to about 1,000 W at a frequency of about 13.56 MHz, and the preferable substrate spacing is between about 300 mils and about 800 mils. Annealing the low dielectric constant film at a substrate temperature of about 200° C. to about 400° C. after the low dielectric constant film is deposited volatilizes at least some of the organic groups in the film, forming voids in the film. Organic groups that may be volatilized are derived from organic components of the gas mixtures described herein, such as the ring of the one or more oxygen-free hydrocarbon compounds comprising one ring and one or two carbon-carbon double bonds in the ring.

In another embodiment, the low dielectric constant film is post-treated with an electron beam treatment. The e-beam treatment typically has a dose between about 50 and about 2000 micro coulombs per square centimeter ($\mu c/cm^2$) at about 1 to 20 kiloelectron volts (KeV). The e-beam treatment is typically operated at a temperature between about room-temperature and about 450° C. for about 1 minute to about 15 minutes, such as about 2 minutes. Preferably, the e-beam treatment is performed at about 400° C. for about 2 minutes. In one aspect, the e-beam treatment conditions include 4.5 kV, 1.5 mA and 150 $\mu c/cm^2$ at 400° C. Although any e-beam device may be used, one exemplary device is the EBK chamber, available from Applied Materials, Inc.

The e-beam curing process improves mechanical strength of the deposited film network and also lowers the k-value. The energized e-beam alters the chemical bonding in the molecular network of the deposited film and removes at least a portion of the molecular groups, such as organic components from the ring of the one or more oxygen-free hydrocarbon compounds comprising one ring and one or two carbon-carbon double bonds in the ring, from the film. The removal of the molecular groups creates voids or pores within the film, lowering the k value. The e-beam treatment also strengthens the film network by cross-linking Si—O—Si or Si—C—Si chains as inferred from FTIR spectroscopy.

In another embodiment, the low dielectric constant film is post-treated by an ultraviolet curing process. Low dielectric constant films cured using the ultraviolet curing process have shown improved barrier layer properties and have shown reduced and minimal resist poisoning. The ultraviolet curing process may be performed in situ within the same processing chamber or system, for example, transferred from one chamber to another without a break in vacuum.

The substrate is introduced into a chamber, which may include the deposition chamber, and the low dielectric constant film is exposed to between about 0.01 milliWatts/$cm^2$ and about 1 watts/$cm^2$ of ultraviolet radiation, for example, between about 0.1 milliWatts/$cm^2$ and about 10 milliwatts/$cm^2$. The ultraviolet radiation may comprise a range of ultraviolet wavelengths, and include one or more simultaneous wavelengths. Suitable ultraviolet wavelengths include between about 1 nm and about 400 nm, and may further include optical wavelengths up to about 600 or 780 nm. The ultraviolet wavelengths between about 1 nm and about 400 nm, may provide a photon energy (electroVolts) between about 11.48 (eV) and about 3.5 (eV). Preferred ultraviolet wavelengths include between about 100 nm and about 350 nm.

Further, the ultraviolet radiation may be applied at multiple wavelengths, a tunable wavelength emission and tunable power emission, or a modulation between a plurality of wavelengths as desired, and may be emitted from a single UV lamp or applied from an array of ultraviolet lamps. Examples of suitable UV lamps include a Xe filled Zeridex™ UV lamp, which emits ultraviolet radiation at a wavelength of about 172 nm or the Ushio Excimer UV lamp, or a Hg Arc Lamp, which emits ultraviolet radioation at wave. The deposited silicon carbide layer is exposed to the ultraviolet radiation for between about 10 seconds and about 600 seconds.

During processing, the temperature of the processing chamber may be maintained at between about 0° C. and about 450° C., for example, between about 20° C. and about 400° C. degrees Celsius, for example about 25° C., and at a chamber pressure between vacuum, for example, less than about 1 mTorr up to about atmospheric pressure, i.e., 760 Torr, for example at about 100 Torr. The source of ultraviolet radiation may be between about 100 mils and about 600 mils from the substrate surface. Optionally, a processing gas may be introduced during the ultraviolet curing process. Suitable processing gases include oxygen ($O_2$), nitrogen ($N_2$), hydrogen ($H_2$), helium (He), argon (Ar), water vapor ($H_2O$), carbon monoxide, carbon dioxide, hydrocarbon gases, fluorocarbon gases, and fluorinated hydrocarbon gases, or combinations thereof. The hydrocarbon compounds may have the formula $C_xH_y$, $C_xF_y$, $C_xF_yH_z$, or combinations thereof, with x an integer between 1 and 6, y is an integer between 4 and 14, and z is an integer between 1 and 3.

EXAMPLE

Porogen-containing organosilicate dielectric layers were deposited on a substrate in accordance with the embodiment described above with respect to FIG. 1. The films were deposited using a PECVD chamber (i.e., CVD chamber) on a PRODUCER® system, available from Applied Materials, Inc. of Santa Clara, Calif. During deposition the chamber pressure was maintained at a pressure of about 4.5 Torr and the substrate was maintained at a temperature of about 350° C. The substrate was positioned 300 mils from the gas distribution showerhead.

The substrate was positioned on a substrate support disposed within a process chamber. The process gas mixture having an initial gas composition of 1000 sccm helium and 700 sccm oxygen for the interface layer was introduced into the chamber and flow rates stabilized before initiation of the RF power. Subsequently, RF power of about 500 W was applied to the showerhead to form a plasma of the interface process gas mixture composition including a OMCTS flow rate of about 300 mg/min. to deposit a silicon oxide initiation layer. After initiation of the RF power for about 2 seconds, the flow rate of OMCTS was increased at a ramp-up rate of about 1500 mg/min./sec. for about 2 seconds. In addition, the flow of $O_2$ was decreased at a ramp-down rate of about 500 sccm/sec.

Upon reaching and keeping a final OMCTS flow rate of about 2000 mg/min, a flow of cyclohexadiene was introduced into the chamber at a ramp-up rate of about 375 mg/min./sec. over about 4 seconds to reach a porogen deposition flow rate of about 1500 mg/min./sec. The final gas mixture composition also includes 900 sccm helium and 160 sccm oxygen. Upon reaching the desired thickness of the porogen-containing organosilicate dielectric layer after about 58 seconds, the RF power (RF and LFRF) is terminated to stop further deposition. After RF power termination, the chamber throttle valve is opened to allow the process gas mixture to be pumped out of the chamber. Analysis of the organosilicate dielectric layer indicates about 7 particle adders above 0.16 µm.

A comparison organosilicate dielectric layer was synthesized using the same process parameters as described, but with the OMCTS and the cyclohexadiene having simultaneous, as opposed to separate, ramp-ups of 750 mg/min./sec. and 375 mg/min./sec., respectively. Analysis of the comparison organosilicate dielectric layer indicates about 74000 particle adders above 0.16 μm.

Many variations of the above example may be practiced. For example, other organosilane precursors, porogen precursors, oxidizing gases, and inert gases may be used. In addition, different flow rates and/or ramp rates may be employed. In one example TMCTS may be used as the organosilane precursor instead of OMCTS. In another example, the organosilane precursor may include a flow of trimethylsilane combined with a flow of OMCTS. In another example bicycloheptadiene may be used as the porogen precursor instead of cyclohexadiene.

Examples of varying porogen transition flow rates and porogen ramp-up rates and their effect on the total number of particle adders are presented in the table below. Increase in porogen transition flow rate and porogen ramp-up rates result in organosilicate dielectric layers with higher levels of particle adders above 0.16 μm.

| Porogen Transition Flow Rate (mg/min.) | Porogen Ramp Rate (mg/min./sec.) | Total particle Adders |
| --- | --- | --- |
| 400 | 400 | 1 |
| 400 | 500 | 3 |
| 400 | 650 | 48 |
| 600 | 400 | 55 |
| 600 | 650 | 23 |
| 600 | 700 | 14955 |
| 600 | 800 | 8949 |

While the foregoing is directed to embodiments of the present invention, other and further embodiments of the invention may be devised without departing from the basic scope thereof, and the scope thereof is determined by the claims that follow.

The invention claimed is:

1. A method of depositing an organosilicate dielectric layer, comprising:
positioning a substrate within a processing chamber the processing chamber having a powered electrode;
flowing an initiation gas mixture into the processing chamber, the initiation gas mixture comprising a flow rate of one or more organosilicon compounds and a flow rate of one or more oxidizing gases;
depositing a initiation layer on the substrate by applying a radio frequency power to the powered electrode;
ramping-up the flow rate of the one or more organosilicon compounds until reaching a final flow rate of the one or more organosilicon compounds while depositing a first transition layer on the initiation layer;
flowing the final flow rate of the one or more organosilicon compounds while flowing a flow rate of a gas mixture comprising one or more porogen compounds;
ramping-up the flow rate of the one or more porogen compounds until reaching a final flow rate of the one or more porogen compounds while depositing a second transition layer on the first transition layer; and
terminating the radio frequency power.

2. The method of claim 1, wherein the one or more organosilicon compounds is selected from the group consisting of tetramethylcyclotetrasiloxane, octamethylcyclotetrasiloxane, pentamethylcyclopentasiloxane, hexamethylcyclotri-siloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)-disiloxane, bis(1-methyldisiloxanyl)methane, bis(1-methyldisiloxanyl)propane, hexamethoxydisiloxane, dimethyldimethoxysilane (DMDMOS), and dimethoxymethylvinylsilane.

3. The method of claim 2, wherein the one or more organosilicon compounds comprises octamethylcyclotetrasiloxane and the one or more porogen compounds comprises 1-methyl-4-(1-methylethyl)-1,3-cyclohexadiene.

4. The method of claim 3, wherein the one or more oxidizing gases comprises carbon dioxide and oxygen.

5. The method of claim 1, wherein the one or more porogen compounds is selected from the group consisting of cyclohexadiene, bicycloheptadiene, 1-methyl-4-(1-methylethyl)-1,3-cyclohexadiene, 1-methyl-4-(1-methylethyl)-Benzene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, and 1,4-dioxin.

6. The method of claim 1, wherein the one or more oxidizing gases is selected from the group consisting of ozone, oxygen, carbon dioxide, carbon monoxide, water, nitrous oxide, 2,3-butanedione, and combinations thereof.

7. The method of claim 1, further comprising post-treating the low dielectric constant film.

8. The method of claim 1, further comprising providing a flow of an inert gas selected from the group consisting of helium, argon, or nitrogen.

9. The method of claim 1, further comprising flowing the final flow rate of the one or more organosilicon compounds and the final flow rate of the one or more porogen compounds to deposit a porogen doped silicon oxide layer on the second transition layer.

10. The method of claim 1, wherein ramping-up the flow rate of the one or more organosilicon compounds comprises a ramp-up rate between about 100 mg/min./sec. and about 5000 mg/min./sec.

11. The method of claim 10, wherein ramping-up the flow rate of the one or more porogen compounds comprises a ramp-up rate between about 100 mg/min./sec. and about 5000 mg/min./sec.

12. The method of claim 11, wherein ramping-up the flow rate of the one or more organosilicon compounds is performed over a time period in the range of between about 1 second and about 10 seconds.

13. The method of claim 12, wherein ramping-up the flow rate of the one or more porogen compounds is performed over a time period in the range of between about 1 second and about 180 seconds.

14. A method for depositing a low dielectric constant film, comprising:
positioning a substrate within a processing chamber, the processing chamber having a powered electrode;
an initiation step comprising:
flowing an initiation gas mixture into the processing chamber, the initiation gas mixture comprising a flow rate of one or more organosilicon compounds and a flow rate of one or more oxidizing gases; and
depositing a silicon oxide layer on the substrate by applying a radio frequency power to the powered electrode;

a first transition step comprising:
  ramping-up the flow rate of the one or more organosilicon compounds until reaching a final flow rate of the one or more organosilicon compounds;
  providing a flow rate of the one or more oxidizing gases into the processing chamber; and
  depositing a first transition layer on the silicon oxide layer by applying the radio frequency power to the powered electrode;
a second transition step comprising:
  providing the final flow rate of the one or more organosilicon compounds into the processing chamber;
  providing the flow rate of one or more oxidizing gases into the processing chamber;
  providing a flow rate of one or more porogen compounds into the processing chamber;
  ramping-up the flow rate of the one or more porogen compounds until reaching a final flow rate of the one or more porogen compounds; and
  depositing a second transition layer on the first transition layer by applying the radio frequency power to the powered electrode; and
a deposition step comprising:
  providing the final flow rate of the one or more organosilicon compounds into the processing chamber;
  providing the final flow rate of the one or more porogen compounds into the processing chamber;
  providing the flow rate of one or more oxidizing gases into the processing chamber; and
  depositing a porogen doped silicon oxide layer on the second transition layer by applying the radio frequency power to the powered electrode.

15. The method of claim 14, wherein the one or more organosilicon compounds is selected from the group consisting of tetramethylcyclotetrasiloxane, octamethylcyclotetrasiloxane, pentamethylcyclopentasiloxane, hexamethylcyclotrisiloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)-disiloxane, bis(1-methyldisiloxanyl)methane, bis(1-methyldisiloxanyl)propane, hexamethoxydisiloxane, dimethyldimethoxysilane (DMDMOS), and dimethoxymethylvinylsilane.

16. The method of claim 15, wherein the one or more organosilicon compounds comprises octamethylcyclotetrasiloxane and the one or more porogen compounds comprises 1-methyl-4-(1-methylethyl)-1,3-cyclohexadiene.

17. The method of claim 16, wherein the one or more oxidizing gases comprises carbon dioxide and oxygen.

18. The method of claim 14, wherein the one or more porogen compounds is selected from the group consisting of cyclohexadiene, bicycloheptadiene, 1-methyl-4-(1-methylethyl)-1,3-cyclohexadiene, 1-methyl-4-(1-methylethyl)-Benzene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, and 1,4-dioxin.

19. The method of claim 14, wherein the one or more oxidizing gases is selected from the group consisting of ozone, oxygen, carbon dioxide, carbon monoxide, water, nitrous oxide, 2,3-butanedione, and combinations thereof.

20. The method of claim 14, further comprising post-treating the low dielectric constant film.

21. The method of claim 14, further comprising providing a flow of an inert gas selected from the group consisting of flow helium, argon, or nitrogen.

22. The method of claim 21, wherein ramping-up the flow rate of the one or more porogen compounds comprises a ramp-up rate between about 100 mg/min./sec. and about 5000 mg/min./sec.

23. The method of claim 14, wherein the low dielectric constant film comprises less than 25 particle adders above 0.16 μm.

24. The method of claim 23, wherein ramping-up the flow rate of the one or more organosilicon compounds is performed over a time period in the range of between about 1 second and about 10 seconds.

25. The method of claim 14, wherein ramping-up the flow rate of the one or more organosilicon compounds comprises a ramp-up rate between about 100 mg/min./sec. and about 5000 mg/min./sec.

26. The method of claim 25, wherein ramping-up the flow rate of the one or more porogen compounds is performed over a time period in the range of between about 1 second and about 180 seconds.

* * * * *

UNITED STATES PATENT AND TRADEMARK OFFICE
CERTIFICATE OF CORRECTION

| | |
|---|---|
| PATENT NO. | : 7,297,376 B1 |
| APPLICATION NO. | : 11/483842 |
| DATED | : November 20, 2007 |
| INVENTOR(S) | : Kang Sub Yim et al. |

It is certified that error appears in the above-identified patent and that said Letters Patent is hereby corrected as shown below:

In the references cited section (56):

Page 2, line 12 delete "6,153, 871 A 11/2000 Livingston" and insert --6,159,871 A 12/2000 Loboda et al.--

Signed and Sealed this

Fourteenth Day of September, 2010

David J. Kappos
*Director of the United States Patent and Trademark Office*